United States Patent
Okitsu

(10) Patent No.: US 7,362,148 B2
(45) Date of Patent: Apr. 22, 2008

(54) DEVICE FOR CONTROLLING A SEMICONDUCTOR ELEMENT

(75) Inventor: Yosuke Okitsu, Kariya (JP)

(73) Assignee: DENSO CORPORATION, Kariya (JP)

( * ) Notice: Subject to any disclaimer, the term of this patent is extended or adjusted under 35 U.S.C. 154(b) by 134 days.

(21) Appl. No.: 11/280,808

(22) Filed: Nov. 17, 2005

(65) Prior Publication Data

US 2006/0109034 A1    May 25, 2006

(30) Foreign Application Priority Data

Nov. 17, 2004    (JP) .............................. 2004-333158

(51) Int. Cl.
*H03K 3/00*    (2006.01)
(52) U.S. Cl. ...................... 327/110; 327/427; 327/437; 324/158.1; 324/765
(58) Field of Classification Search ...................... None
See application file for complete search history.

(56) References Cited

U.S. PATENT DOCUMENTS

| | | | | |
|---|---|---|---|---|
| RE32,526 E | * | 10/1987 | Hochstein | .................... 327/432 |
| 4,841,166 A | * | 6/1989 | Harnden | ...................... 327/110 |
| 5,347,169 A | * | 9/1994 | Preslar et al. | ................ 327/110 |
| 6,720,819 B1 | * | 4/2004 | Yamamoto | .................... 327/427 |
| 6,891,342 B2 | | 5/2005 | Nakamura et al. | |
| 7,046,050 B1 | * | 5/2006 | Schottler | ..................... 327/108 |
| 7,126,802 B2 | * | 10/2006 | Ishikawa et al. | ............... 361/94 |
| 7,176,744 B2 | * | 2/2007 | Goudo | ........................ 327/434 |
| 2001/0005152 A1 | * | 6/2001 | Karaki et al. | ................ 327/109 |
| 2003/0197543 A1 | * | 10/2003 | Imai | ............................ 327/427 |

* cited by examiner

*Primary Examiner*—Tuan T Lam
(74) *Attorney, Agent, or Firm*—Posz Law Group, PLC

(57) ABSTRACT

A control device for controlling a load drive semiconductor element for driving a load has a test operation mode for measuring a leak current of the load drive semiconductor element. In the test operation mode, a control terminal of the load drive semiconductor element is electrically separated from a power source or a ground by turning off another semiconductor element. Therefore, no electric current flows from the power source to the control terminal or from the control terminal to the ground. Therefore, the leak current of the load drive semiconductor element can be easily measured, even after the load drive semiconductor element is electrically connected to the control device for fabricating one-packaged IC.

13 Claims, 5 Drawing Sheets

DEVICE FOR CONTROLLING A SEMICONDUCTOR ELEMENT

CROSS REFERENCE TO RELATED APPLICATION

This application is based on Japanese Patent Application No. 2004-333158 filed on Nov. 17, 2004, the disclosure of which is incorporated herein by reference.

FIELD OF THE INVENTION

The present invention relates to a device for controlling a semiconductor element connected in series with a load.

BACKGROUND OF THE INVENTION

A vehicle (e.g., an automobile) has a blower motor or a cooling fan motor used in a vehicular air conditioner of the vehicle. FIG. 5 shows a circuit configuration of a motor drive device for driving such motors. In the motor drive device, a series circuit including a P-channel metal oxide semiconductor field-effect transistor (MOSFET) 1 and a load 2 such as a DC motor is interposed between a positive terminal (+B) of a battery (power source) and ground. In other words, the load 2 is connected in a high side drive configuration in which the MOSFET 1 is provided in the high potential side. The DC motor rotates a blower fan (not shown) so that an air conditioner blows air out.

Further, another series circuit including a P-channel MOSFET 3, a resistor 4, a resistor 5, an N-channel MOSFET 6, and a resistor 7 is interposed between the positive terminal of the battery and the ground. The gate of the MOSFET 1 is connected to a connection point between the resistor 4 and the resistor 5. A pull-up resistor 8 is interposed between the gate of the MOSFET 1 and the positive terminal of the battery. The resistors 4,5,7 adjust a time constant required to drive the gate of the MOSFET 1.

A drive control circuit 9 receives a drive control signal Sd (i.e., a command for applying a voltage to the load 2) outputted from an air-conditioner Electronic Control Unit (ECU) that controls the air conditioner. The drive control signal Sd is a pulse-width modulation (PWM) signal having a carrier frequency of 5 kHz, for example. The drive control circuit 9 performs frequency-to-voltage conversion, for example, by means of a filter so that the PWM signal is converted to a voltage signal. The drive control circuit 9 creates a drive command signal based on the voltage signal and outputs the drive command signal to the gates of both the MOSFET 3 and the MOSFET 6, thereby turning on one of the MOSFET 3 and the MOSFET 6.

Specifically, when the MOSFET 3 is turned off and the MOSFET 6 is turned on, the gate of the MOSFET 1 changes to a low level so that the MOSFET 1 is turned on and the load 2 is energized. In contrast, when the MOSFET 3 is turned on and the MOSFET 6 is turned off, the gate of the MOSFET 1 changes to a high level so that the MOSFET 1 is turned off and the load 2 is not energized.

The circuit components except the MOSFET 1 and the load 2 construct a control integrated circuit (IC) 10. The control IC 10 and the MOSFET 1 are one-packaged as a motor drive IC 11. A motor drive device having a circuit configuration similar to the control IC 10 is disclosed in U.S. Pat. No. 6,891,342 corresponding to JP-A-2004-72977, for example.

In the motor drive device shown in FIG. 5, when an input terminal for applying the drive control signal Sd to the drive control circuit 9 becomes a high-impedance state, the control IC 10 stops its operation so that both the MOSFET 3 and the MOSFET 6 are turned off. In this case, the pull-up resistor 8 keeps the gate voltage of the MOSFET 1 at high level. Thus, a voltage between the gate and the source of the MOSFET 1 becomes 0 V, and the MOSFET 1 is turned off.

To check the quality of the MOSFET 1, a leak current flowing between the gate and the source of the MOSFET 1 is measured. Generally, the leak current measurement is performed before connecting the MOSFET 1 to the control IC 10, and then only the MOSFET 1 that passed the quality check is used for fabricating the motor drive IC 11.

However, when the MOSFET 1 is connected to the control IC 10 through a bonding wire, impact force may be applied to the MOSFET 1. As a result of the impact force, the MOSFET 1 may be broken so that the quality of the motor drive IC 11 may be decreased. In order to improve the quality of the motor drive IC 11, therefore, it is preferable that the quality of the MOSFET 1 is rechecked by re-measuring its leak current after connecting the MOSFET 1 to the control IC 10.

However, it is difficult to measure the leak current of the MOSFET 1 in such a manner, because the pull-up resistor 8 allows an electric current to flow into the gate of the MOSFET 1 and the electric current is smaller than the leak current.

SUMMARY OF THE INVENTION

In view of the above problem, it is an object of the present invention to provide a control device for controlling a load drive semiconductor element, a leak current of which can be accurately measured even after electric connection of the load drive semiconductor element to the control device.

According to an aspect of the present invention, a control device for controlling a load drive semiconductor element for driving a load has a test operation mode for measuring a leak current of the load drive semiconductor element.

In the test operation mode, a control terminal of the load drive semiconductor element can be electrically separated from a power source or a ground by turning off another semiconductor element. Therefore, no electric current flows from the power source to the control terminal or from the control terminal to the ground. Thus, the leak current of the load drive semiconductor element can be easily measured, even after the load drive semiconductor element is electrically connected to the control device.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

First Embodiment

Figure 1:
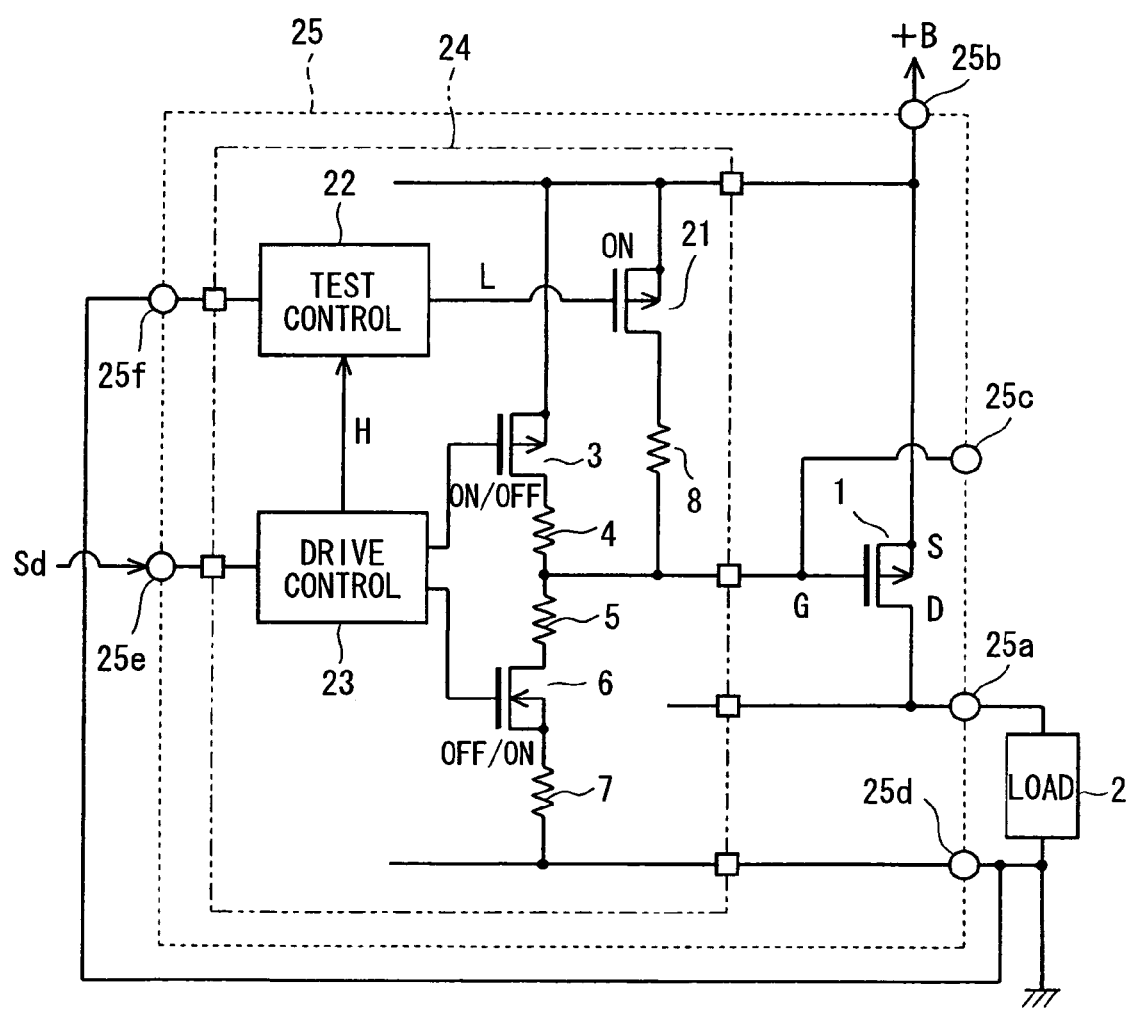
FIG. 1 is a circuit diagram showing a normal operation mode of a load drive IC according to an embodiment of the present invention.
Figure 2:
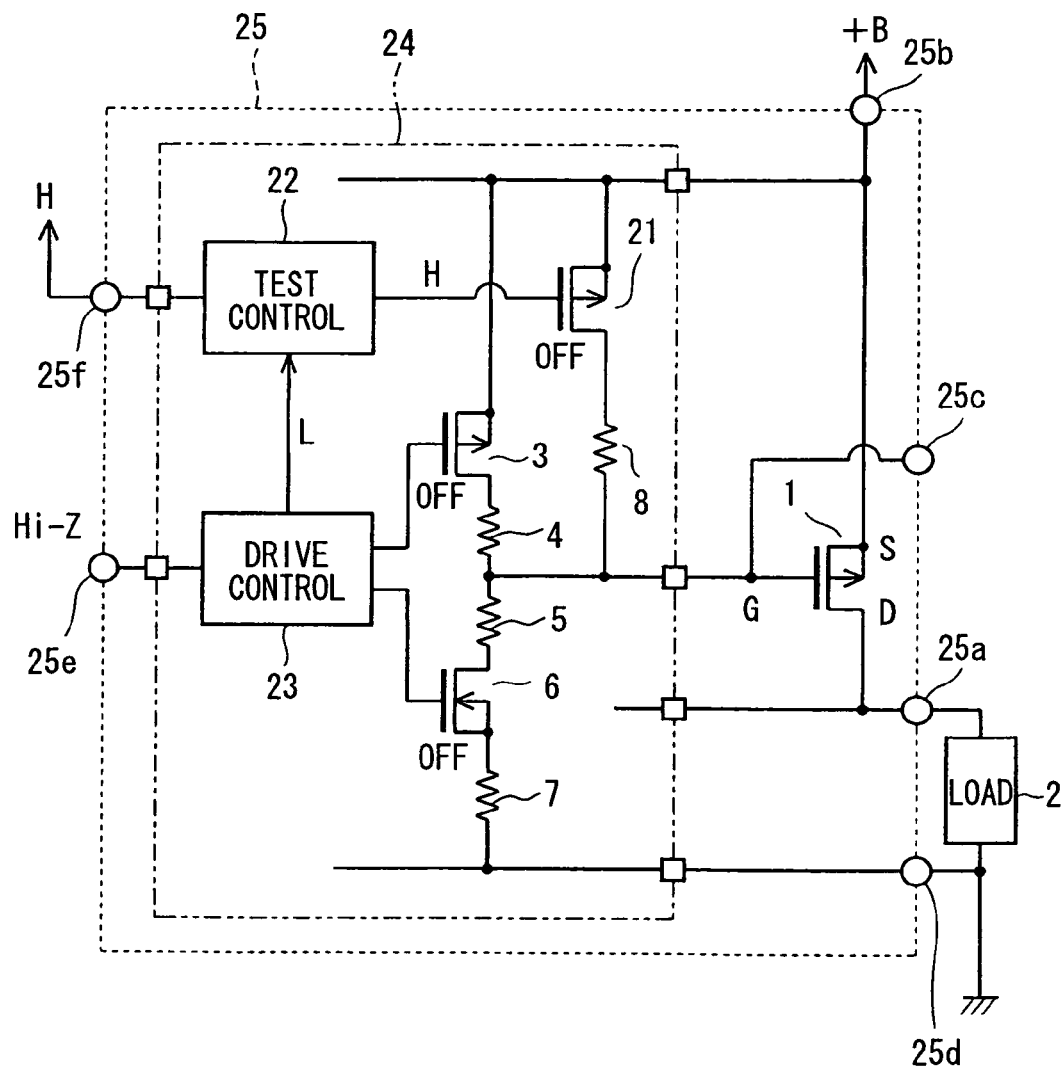
FIG. 2 is a circuit diagram showing a test operation mode of the load drive IC.

References are made to FIGS. 1 and 2, which show a circuit configuration of a control IC 24 according to a first embodiment of the present invention.

In the first embodiment, a P-channel MOSFET 1 (a load drive semiconductor element) and a load 2 are connected in series with each other and interposed between a positive terminal (+B) of a battery (power supply) and a ground. In other words, the load 2 is connected in a high side drive circuit configuration in which the MOSFET 1 is provided in the high potential side. As an example, the load 2 is a DC motor for rotating a blower fan of a vehicle.

A first series circuit including a P-channel MOSFET 3, a resistor 4, a resistor 5, an N-channel MOSFET 6, and a resistor 7 is interposed between the positive terminal of the battery and the ground. The gate G of the MOSFET 1 is connected to a connection point between the resistor 4 and the resistor 5. The resistors 4,5,7 adjust a time constant required to drive the gate G of the MOSFET 1.

Further, a second series circuit including a pull-up resistor 8 and a P-channel MOSFET 21 is interposed between the gate G of the MOSFET 1 and the positive terminal of the battery.

A drive control circuit 23 receives a drive control signal Sd (i.e., a command for applying a voltage to the load 2) outputted from an external circuit such as an air-conditioner ECU. The drive control signal Sd is a PWM signal having a carrier frequency of 5 kHz, for example. The drive control circuit 23 performs frequency-to-voltage conversion, for example, by means of a filter so that the PWM signal is converted to a voltage signal. Then, the drive control circuit 23 creates a drive command signal (high-level signal or low-level signal) based on the voltage signal and outputs the drive command signal to the gates of both the MOSFET 3 and the MOSFET 6, thereby turning on one of the MOSFET 3 and the MOSFET 6. Specifically, when the drive command signal is a high-level signal, the MOSFET 3 is turned off and the MOSFET 6 is turned on. In contrast, when the drive command signal is a low-level signal, the MOSFET 3 is turned on and the MOSFET 6 is turned off.

When the MOSFET 3 is turned off and the MOSFET 6 is turned on, the gate voltage of the MOSFET 1 changes to a low level so that the MOSFET 1 is turned on and the load 2 is energized. In contrast, when the MOSFET 3 is turned on and the MOSFET 6 is turned off, the gate voltage of the MOSFET 1 changes to a high level so that the MOSFET 1 is turned off and the load 2 is not energized.

A current path between the positive terminal of the battery and the gate G of the MOSFET 1 is switched on and off by the MOSFET 21, the gate of which is driven by the drive control circuit 23 through a test control circuit 22.

In a normal operation mode for driving the load 2, the drive control circuit 23 outputs a gate-on signal (high-level signal H) to the test control circuit 22, irrespective of whether one of the MOSFET 3 and the MOSFET 6 is turned on, or whether both of the MOSFET 3 and the MOSFET 6 are turned off. The gate-on signal allows the test control circuit 22 to output a low-level signal L to the gate of MOSFET 21.

The test control circuit 22 is a gate driver having a logic circuit. The test control circuit 22 receives the gate-on signal from the drive control circuit 23 or a test signal (high-level signal H) from an external circuit through the test signal input terminal 25f. The test control circuit 22 keeps the gate voltage of the MOSFET 21 at high level or low level in accordance with the received signal.

Figure 3:
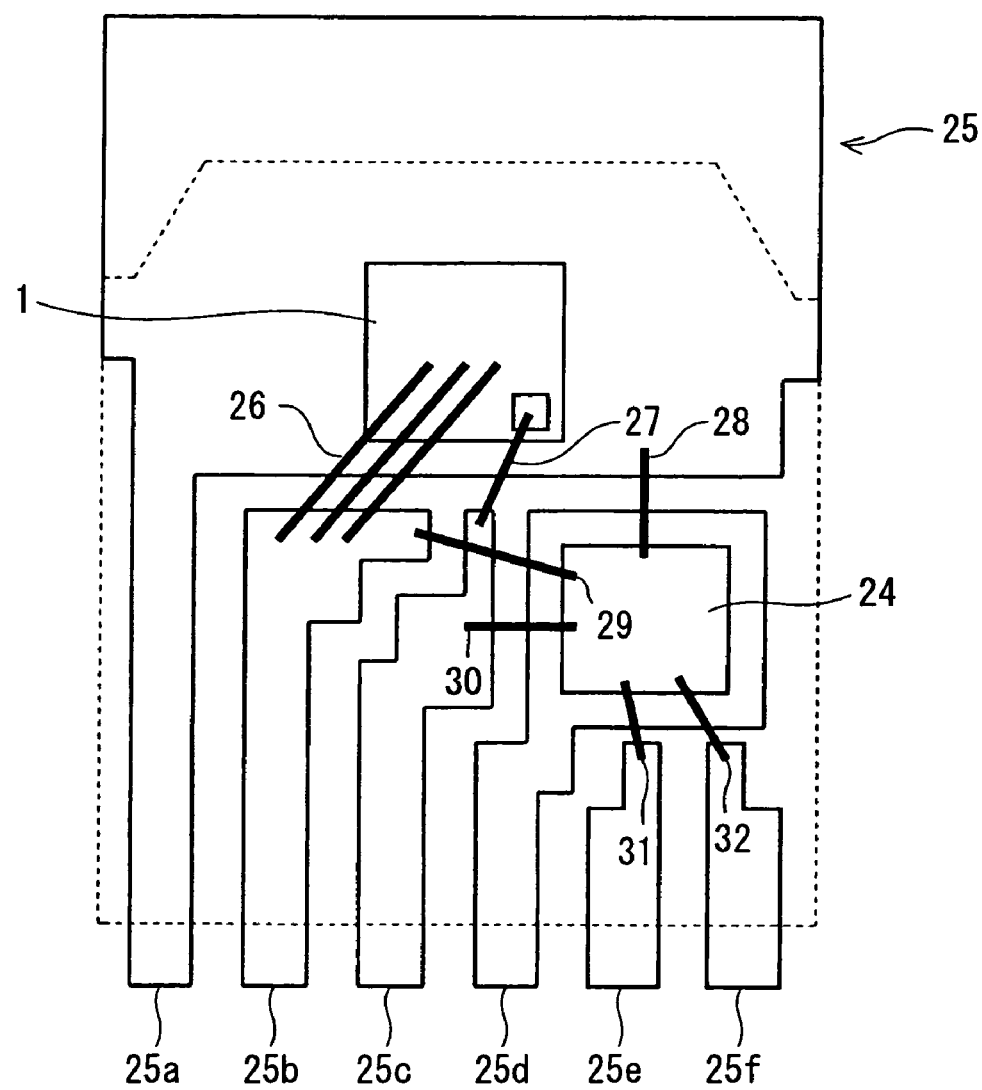
FIG. 3 is a plan view illustrating a MOSFET and a control IC that are one-packaged as the load drive IC.

The circuit components except the MOSFET 1 and the load 2 construct the control IC 24, and the control IC 24 and the MOSFET 1 are one-packaged as a load drive IC 25 as shown in FIG. 3.

The MOSFET 1 is mounted on a drain terminal 25a of the motor drive IC 25 and the drain D of the MOSFET 1 has an ohmic contact with the drain terminal 25a. A power supply terminal 25b of the motor drive IC 25 is connected to the source S of the MOSFET 1 through bonding wires 26. A gate terminal 25c of the motor drive IC 25 is connected to the gate G of the MOSFET 1 through a bonding wire 27.

An electrode portion of the drain terminal 25a occupies an upper half area of the motor drive IC 25. An electrode portion of a ground terminal 25d of the load drive IC 25 is arranged in the lower right area in FIG. 3 relative to the electrode portion of the drain terminal 25a. The control IC 24 is mounted on the electrode portion of the ground terminal 25d, and the ground of the control IC 24 has an ohmic contact with the ground terminal 25d. The control IC 24 is connected to the drain terminal 25a, the power supply terminal 25b, the gate terminal 25c, the drive signal input terminal 25e, and the test signal input terminal 25f through bonding wires 28-32, respectively.

Operations of the control IC 24 is described below.

The control IC 24 has the normal operation mode for driving the load 2 and a test operation mode for measuring a leak current flowing between the source S and the gate G of the MOSFET 1.

In the normal operation mode shown in FIG. 1, there is no need to apply the test signal to the test signal input terminal 25f. Therefore, the test signal input terminal 25f is connected to the ground so as to prevent a noise from affecting the test control circuit 22.

When the drive control circuit 23 receives the drive control signal Sd through the drive input terminal 25e, one of the MOSFET 3 and the MOSFET 6 is turned on. In contrast, when the drive control circuit 23 does not receive the drive control signal Sd, the drive input terminal 25e becomes a high-impedance state. As a result of the high-impedance state, both the MOSFET 3 and the MOSFET 6 are turned off.

The drive control circuit 23 outputs the gate-on signal to the test control circuit 22 during the normal operation mode, irrespective of whether one of the MOSFET 3 and the MOSFET 6 is turned on, or whether both the MOSFET 3 and the MOSFET 6 are turned off. The test control circuit 22 keeps the gate voltage of the MOSFET 21 at low level while receiving the gate-on signal. Thus, the MOSFET 21 stays ON during the normal operation mode. Therefore, even when both of the MOSFET 3 and the MOSFET 6 are turned off, the gate voltage of the MOSFET 1 is pulled up to the power voltage +B through the pull-up resistor 8 and the MOSFET 21. In other words, when the drive control circuit 23 does not receive the drive control signal Sd, the gate voltage of the MOSFET 1 becomes high so that the MOSFET 1 stays OFF.

In the test operation mode shown in FIG. 2, the test signal is applied to the test signal input terminal 25f, and the test control circuit 22 receives the test signal. The drive control circuit 23 outputs a gate-off signal (low-level signal L) to the test control circuit 22 during the test operation mode. The test control circuit 22 keeps the gate voltage of the MOSFET 21 at high level while receiving the test signal and the gate-off signal. Thus, the MOSFET 21 stays OFF during the test operation mode. As long as the MOSFET 21 stays OFF, the current path between the positive terminal of the battery and the gate G of the MOSFET 1 remains broken so that no electric current flows into the gate G of the MOSFET 1 through the pull-up resistor 8. In this state, the leak current of the MOSFET 1 can be measured by connecting current probes to the power supply terminal 25b and the gate terminal 25c of the load drive IC 25.

According to the first embodiment, the control IC 24 has the test operation mode for measuring the leak current of the MOSFET 1. In the test operation mode, the gate G of the MOSFET 1 is electrically separated from the power source by turning off the MOSFET 21. Thus, the leak current of the MOSFET 1 can be easily measured, even after the MOSFET 1 is electrically connected to the control IC 24 for fabricating the load drive IC 25. Therefore, the quality of the load drive IC 25 can be improved.

Further, in the normal mode for driving the load 2, the drive control circuit 23 outputs the gate-on signal to the test control circuit 22 so as to drive the gate of the MOSFET 21, irrespective of whether one of the MOSFET 3 and the MOSFET 6 is turned on, or whether both of the MOSFET 3 and the MOSFET 6 are turned off. Therefore, the MOSFET 21 can stay ON during the normal operation mode without an additional signal from an external circuit. Thus, when the drive control circuit 23 does not receive the drive control signal Sd, the gate voltage of the MOSFET 1 becomes high so that the MOSFET 1 stays OFF.

Second Embodiment

Figure 4:
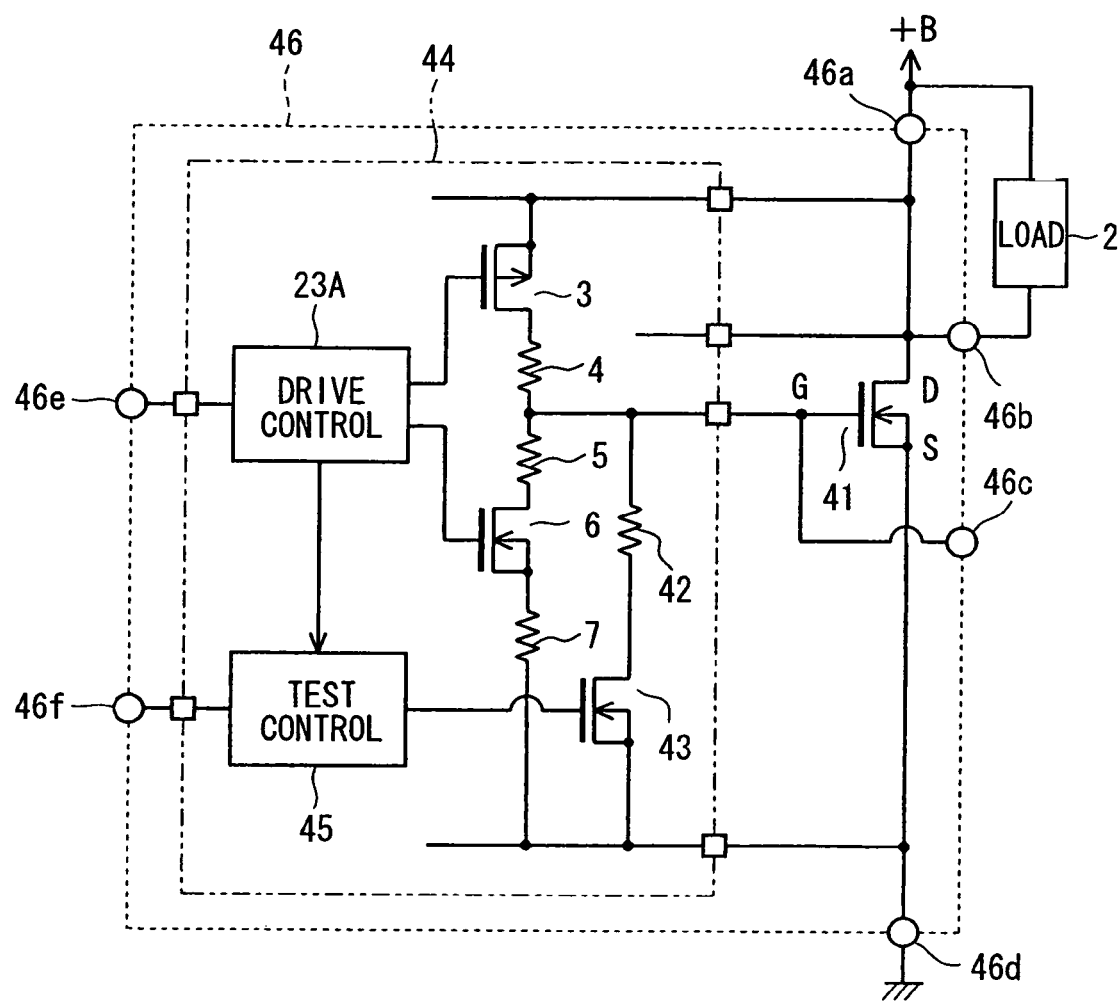
FIG. 4 is a circuit diagram showing a load drive IC according to another embodiment of the present invention.
Figure 5:
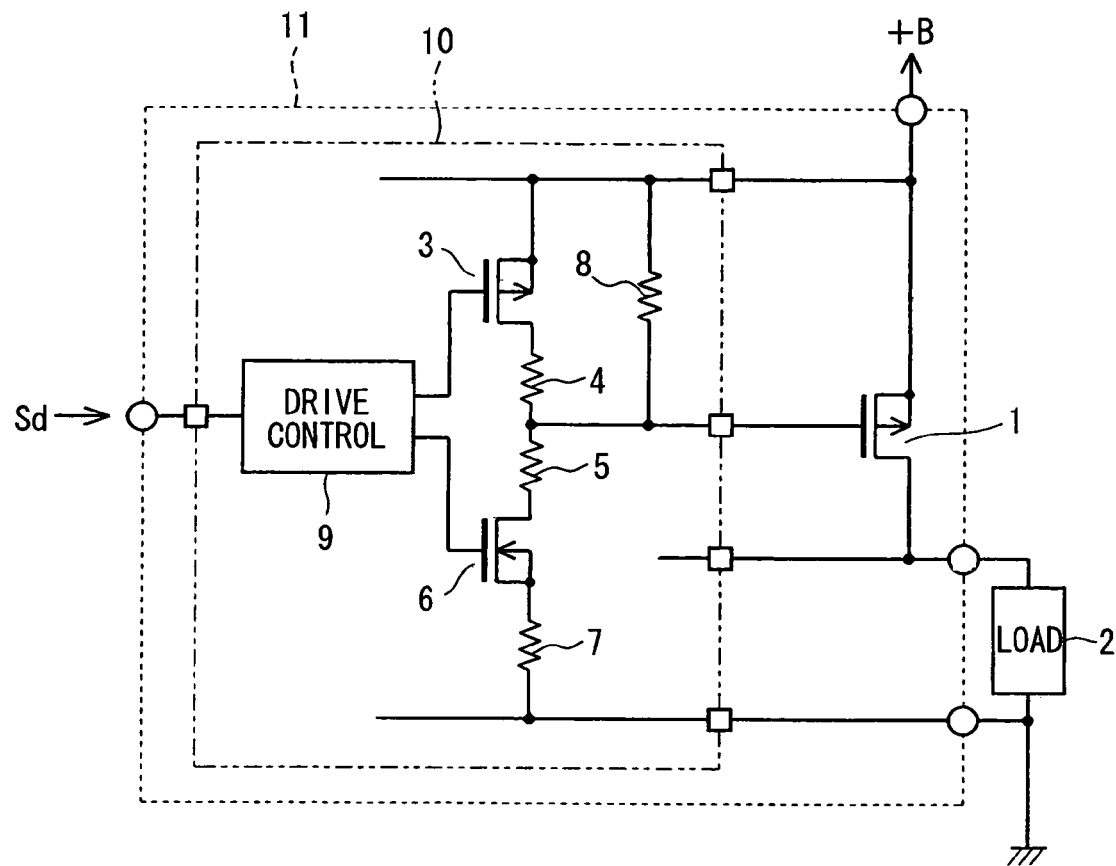
FIG. 5 is a circuit diagram showing a motor drive IC according to prior art.

In the second embodiment shown in FIG. 4, the load 2 is connected in a low side drive configuration such that the source S of an N-channel MOSFET 41 is connected to the ground and the load 2 is connected to the drain D of the N-channel MOSFET 41 at one end and connected to the positive terminal of the battery at the other end. A series circuit including a pull-down resistor 42 and an N-channel MOSFET 43 is interposed between the gate G of the MOSFET 41 and the ground.

Therefore, when a drive control circuit 23A outputs a high-level signal to the gates of both the MOSFET 3 and the MOSFET 6, the MOSFET 41 is turned on. In contrast, when the drive control circuit 23A outputs a low-level signal to the gates of both the MOSFET 3 and the MOSFET 6, the MOSFET 41 is turned off.

The control IC 44 and the MOSFET 41 are one-packaged as a load drive IC 46. The load drive IC 46 has a drain terminal 46a, a power supply terminal 46b, a gate terminal 46c, a ground terminal 46d, a drive signal input terminal 46e, and a test signal input terminal 46f, corresponding to each terminal of the load drive IC 25.

When the drive control circuit 23A receives the drive control signal Sd through the drive signal input terminal 46e, one of the MOSFET 1 and the MOSFET 3 is turned on. In contrast, when the drive control circuit 23A does not receive the drive control signal Sd, the drive signal input terminal 46e becomes a high-impedance state so that both of the MOSFET 1 and the MOSFET 3 are turned off.

In the normal operation mode for driving the load 2, the drive control circuit 23A outputs the gate-on signal (high-level signal) to a test control circuit 45, irrespective of whether one of the MOSFET 3 and the MOSFET 6 is turned on, or whether both of the MOSFET 3 and the MOSFET 6 are turned off. The test control circuit 45 keeps the gate voltage of the MOSFET 43 at high level while receiving the gate-on signal. Thus, the MOSFET 43 stays ON during the normal operation mode. Therefore, even when both of the MOSFET 3 and the MOSFET 6 are turned off, the gate voltage of the MOSFET 41 is pulled down to the ground through the pull-down resistor 42 and the MOSFET 43. In other words, when the drive control circuit 23A does not receive the drive control signal Sd, the gate voltage of the MOSFET 41 becomes low so that the MOSFET 41 stays OFF.

In the test operation mode for measuring the leak current of the MOSFET 41, the test signal (high-level signal) is applied to the test signal input terminal 46f, and the test control circuit 45 receives the test signal. The drive control circuit 23A outputs the gate-off signal (low-level signal) to the test control circuit 45 during the test operation mode. The test control circuit 45 keeps the gate voltage of the MOSFET 43 at low level while receiving the test signal and the gate-off signal. Thus, the MOSFET 43 stays OFF during the test operation mode. As long as the MOSFET 43 stays OFF, the current path between the ground and the gate G of the MOSFET 41 remains broken so that no electric current flows from the gate G of the MOSFET 41 to the ground through the pull-down resistor 42. In this state, the leak current of the MOSFET 41 can be measured by connecting current probes to the power supply terminal 46b and the gate terminal 46c of the load drive IC 46.

According to the second embodiment, the control IC 44 has the test operation mode for measuring the leak current of the MOSFET 41. In the test operation mode, the gate G of the MOSFET 41 is electrically separated from the ground by turning off the MOSFET 43. Therefore, the leak current can be easily measured, even after the MOSFET 41 is electrically connected to the control IC 44 for fabricating the load drive IC 46.

Further, in the normal mode for driving the load 2, the drive control circuit 23A outputs the gate-on signal to the test control circuit 45 so as to drive the gate of the MOSFET 43, irrespective of whether one of the MOSFET 3 and the MOSFET 6 is turned on, or whether both of the MOSFET 3 and the MOSFET 6 are turned off. Therefore, the MOSFET 43 can stay ON during the normal operation mode without an additional signal from an external circuit. Thus, when the drive control circuit 23A does not receive the drive control signal Sd, the gate voltage of the MOSFET 41 becomes low so that the MOSFET 41 stays OFF.

The embodiments described above may be modified in various ways. For example, the test signal input terminal 25f, 46f may be pulled-down to the ground inside the control IC 24, 44. In such an approach, the noise affecting the test control circuit 22, 45 may be prevented in the normal operation mode without connecting the test signal input terminal 25f, 46f to the ground outside the load drive IC 25, 46.

Further, a power transistor and an insulated-gate bipolar transistor (IGBT) may be used instead of the MOSFET 1, 3, 6, 21, 41, 43.

The present invention may be applied to a device for controlling a semiconductor element for driving various loads including the blower fan motor, as long as the semiconductor element is connected in series with the load.

Such changes and modifications are to be understood as being within the scope of the present invention as defined by the appended claims.

What is claimed is:

1. A control device for controlling a load drive semiconductor element for driving a load, the load drive semiconductor element having a control terminal and being connected in series with the load, the load drive semiconductor element and the load being interposed between a power supply terminal and a ground terminal, the device comprising:
- a first series circuit including a first switch and a second switch, the first series circuit being interposed between the power supply terminal and the ground terminal and being connected to the control terminal at a connection point between the first switch and the second switch;
- a drive control circuit which changes a voltage of the control terminal of the load drive semiconductor element by selectively turning on one of the first switch and the second switch;
- a second series circuit including a third switch and a resistor and interposed between one of the power supply terminal and the ground terminal, and the connection point between the first switch and the second switch; and
- a test control circuit, which provides one of a first signal and a second signal to the third switch, wherein
- the load drive semiconductor element is energized based on the voltage of the control terminal, and
- the third switch is turned on while receiving the first signal and turned off while receiving the second signal.

2. The device according to claim 1, wherein
the load drive semiconductor element is a P-channel MOSFET, and
the second series circuit is interposed between the power supply terminal and the control terminal of the load drive semiconductor element.

3. The device according to claim 1, wherein
the load drive semiconductor element is an N-channel MOSFET, and
the second series circuit is interposed between the ground terminal and the control terminal of the load drive semiconductor element.

4. The device according to claim 1, further comprising:
- a first terminal connected to the control terminal of the load drive semiconductor element; and
- a second terminal connected to the power supply terminal, wherein
- a leak current of the load drive semiconductor element is detectable between a first contact connected to the first terminal and a second contact connected to the second terminal, when all the switches are turned off.

5. The device according to claim 1, wherein
the drive control circuit receives a third signal from an external circuit,
the drive control circuit provides a fourth signal to the test control circuit and selectively turns on one of the first switch and the second switch, while receiving the third signal, and
the test control circuit provides the first signal to the third switch while receiving the fourth signal.

6. The device according to claim 5, wherein
the test control circuit receives a fifth signal from an external circuit, and
the test control circuit provides the second signal to the third switch while receiving the fifth signal.

7. The device according to claim 6, wherein
the drive control circuit includes a third terminal through which the drive control circuit receives the third signal, and
the test control circuit includes a fourth terminal through which the test control circuit receives the fifth signal.

8. The device according to claim 1, wherein each of the switches is a semiconductor element.

9. The device according to claim 8, wherein the semiconductor element is a MOSFET.

10. A control device for controlling a load drive semiconductor element for driving a load, the load drive semiconductor element having a control terminal and being connected in series with the load, the device comprising:
- two control semiconductor elements interposed between a power supply potential and a ground potential and having a connection point at which the control semiconductor elements are connected in series with each other and connected to the control terminal of the load drive semiconductor element;
- a drive control circuit which changes a voltage potential of the control terminal by selectively turning on one of the control semiconductor elements;
- a series circuit including a current-path-break semiconductor element and a resistor; and
- a test control circuit which provides one of a first signal and a second signal to the current-path-break semiconductor element,
- wherein the load drive semiconductor element is energized based on the voltage potential of the control terminal,
- wherein the series circuit is interposed between one of the power supply potential and the ground potential, and the connection point between the control semiconductor elements, and
- wherein the current-path-break semiconductor element is turned on while receiving the first signal and turned off while receiving the second signal.

11. The device according to claim 10,
wherein the drive control circuit receives a third signal from an external circuit,
wherein the drive control circuit provides a fourth signal to the test control circuit and selectively turns on one of the control semiconductor elements, while receiving the third signal, and
wherein the test control circuit provides the sixth signal to the current-path-break semiconductor element, while receiving the fourth signal.

12. The device according to claim 10,
wherein the test control circuit receives a fifth signal from an external circuit, and
wherein the test control circuit provides the second signal to the current-path-break semiconductor element, while receiving the fifth signal.

13. The device according to claim 12,
wherein the drive control circuit includes a first terminal through which the drive control circuit receives the third signal, and
wherein the test control circuit includes a second terminal through which the test control circuit receives the fifth signal.

* * * * *